United States Patent
Tatah et al.

[11] Patent Number: 6,060,127
[45] Date of Patent: May 9, 2000

[54] MECHANICALLY RESTRICTED LASER DEPOSITION

[75] Inventors: Abdelkrim Tatah, Arlington; Makoto Ishizuka, Newton, both of Mass.

[73] Assignee: Matsushita Electric Industrial Co., Ltd., Osaka, Japan

[21] Appl. No.: 09/052,773

[22] Filed: Mar. 31, 1998

[51] Int. Cl.[7] .................................................. H05B 7/00
[52] U.S. Cl. .................... 427/458; 427/531; 427/586; 427/596; 427/597; 427/256
[58] Field of Search .................................. 427/458, 531, 427/586, 596, 597, 256

[56] References Cited

U.S. PATENT DOCUMENTS

| | | | |
|---|---|---|---|
| 3,560,258 | 2/1971 | Brisbane | 117/212 |
| 3,781,978 | 1/1974 | Intrator et al. | 29/589 |
| 4,349,583 | 9/1982 | Kulynych et al. | 427/53.1 |
| 4,432,855 | 2/1984 | Romankiw et al. | 204/207 |
| 4,622,058 | 11/1986 | Leary-Renick et al. | 65/105 |
| 4,714,628 | 12/1987 | Eloy | 427/53.1 |
| 4,725,877 | 2/1988 | Brasen et al. | 357/71 |
| 4,734,550 | 3/1988 | Imamura et al. | 219/121 LT |
| 4,752,455 | 6/1988 | Mayer | 427/53.1 |
| 4,758,388 | 7/1988 | Hamada et al. | 264/25 |
| 4,832,798 | 5/1989 | Cvijanovich et al. | 204/15 |
| 4,895,735 | 1/1990 | Cook | 427/43.1 |
| 4,933,204 | 6/1990 | Warren, Jr. et al. | 427/53.1 |
| 4,987,006 | 1/1991 | Williams et al. | 427/53.1 |
| 4,987,007 | 1/1991 | Wagal et al. | 427/53.1 |
| 5,057,184 | 10/1991 | Gupta et al. | 219/65 |
| 5,079,070 | 1/1992 | Chalco et al. | 428/209 |
| 5,141,602 | 8/1992 | Chen et al. | 205/103 |
| 5,153,408 | 10/1992 | Handford et al. | 219/121.64 |
| 5,168,454 | 12/1992 | LaPlante et al. | 364/474.08 |
| 5,173,441 | 12/1992 | Yu et al. | 437/173 |
| 5,175,504 | 12/1992 | Henley | 324/501 |
| 5,177,594 | 1/1993 | Chance et al. | 257/678 |
| 5,203,929 | 4/1993 | Takayanagi et al. | 148/121 |
| 5,235,272 | 8/1993 | Henley | 324/158 R |
| 5,246,745 | 9/1993 | Baum et al. | 427/586 |
| 5,330,968 | 7/1994 | Nagaishi et al. | 505/474 |
| 5,492,861 | 2/1996 | Opower | 437/173 |
| 5,683,601 | 11/1997 | Tatah | 219/121.85 |
| 5,871,826 | 2/1999 | Mei et al. | 427/596 |

*Primary Examiner*—Timothy Meeks
*Attorney, Agent, or Firm*—Ratner & Prestia

[57] ABSTRACT

An apparatus for metal line deposition and a method for metal line deposition using the apparatus. A donor plate has a donor substrate transparent to a focused coherent light beam and a donor surface. The donor surface of the donor plate has a channel formed therein. The channel is coated with a metallic material. A deposition substrate onto which the metal line is to be deposited is disposed adjacent the donor surface of the donor plate. The focused coherent light beam is directed through the donor substrate of the donor plate and onto the metallic coating in the channel. The focused coherent light beam causes the metallic material to ablate from the channel by discharging ions of the metallic material away from the channel and onto the deposition substrate to form the metal line.

7 Claims, 7 Drawing Sheets

MECHANICALLY RESTRICTED LASER DEPOSITION

FIELD OF THE INVENTION

This invention relates generally to metal line deposition. In particular, this invention relates to mechanically restricted laser ablation forward metal line deposition.

BACKGROUND OF THE INVENTION

Metal lines are commonly used for connecting circuits in printed circuit boards and multichip modules. Existing metal line deposition techniques include laser chemical vapor deposition and laser deposition from metal precursors. These techniques, however, have certain disadvantages associated with them. Chemical vapor deposition processes require toxic gases and a vacuum chamber. Deposition from metal precursors requires wet processing that can damage or introduce defects in the surrounding circuitry.

A less expensive and more environmentally friendly metal deposition technique is laser ablation. Laser ablation of metal films in general is a known technique wherein a laser beam is focused onto the metal film. The heat and shock wave generated by the laser beam remove, or discharge, particles of the film. Thin films of metals such as copper, gold, silver and aluminum may be easily removed, or ablated, using green light lasers, such as Q-switched doubled Nd:YAG, Nd:YLF, or copper vapor lasers.

One such laser ablation technique involves the use of pulsed-laser deposition in order to layer complex thin films on substrates. Using this technique, a focused laser beam is directed onto a target film at an angle. The plume of particles that are ablated from the film land on a substrate that is positioned parallel to the target. The particles are thus deposited onto the substrate to form a thin epitaxial coating. Both the substrate and the target are contained in a vacuum environment in this technique. This technique is useful for coating wide surfaces but not localized conductive metal lines. When using this technique for depositing metal lines, as the particles are deposited onto the substrate, the particles are not confined to the area of the metal line. This results in deposition of metal droplets and mist outside the area defined for the metal line.

SUMMARY OF THE INVENTION

The present invention provides an apparatus for metal line deposition and a method for metal line deposition using the apparatus. The apparatus includes a donor plate having a donor substrate transparent to a focused coherent light beam. The donor plate has a donor surface with a channel formed therein. The channel is coated with a metallic material. A deposition substrate onto which the metal line is to be deposited is disposed adjacent the donor surface of the donor plate. The focused coherent light beam is directed through the donor substrate of the donor plate and onto the metallic coating in the channel. The focused coherent light beam causes the metallic material to ablate from the channel by discharging ions of the metallic material away from the channel and onto the deposition substrate to form the metal line. The channel acts to confine the metallic material to a prescribed area of the deposition substrate.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

In this invention, laser ablation is used to deposit metal lines on substrates by the ablation of a metal film from a donor plate, in a dry process that does not require a vacuum. The metal film is contained in a channel of the donor plate. The channel may restrict the area of metal deposition on a substrate. In addition, an electric field may be applied across the donor plate being ablated and the substrate onto which the metal lines are deposited to drive the ablated metal ions toward the deposition location and to electrostatically bond the metal ions to the surface of the substrate.

Figure 1:
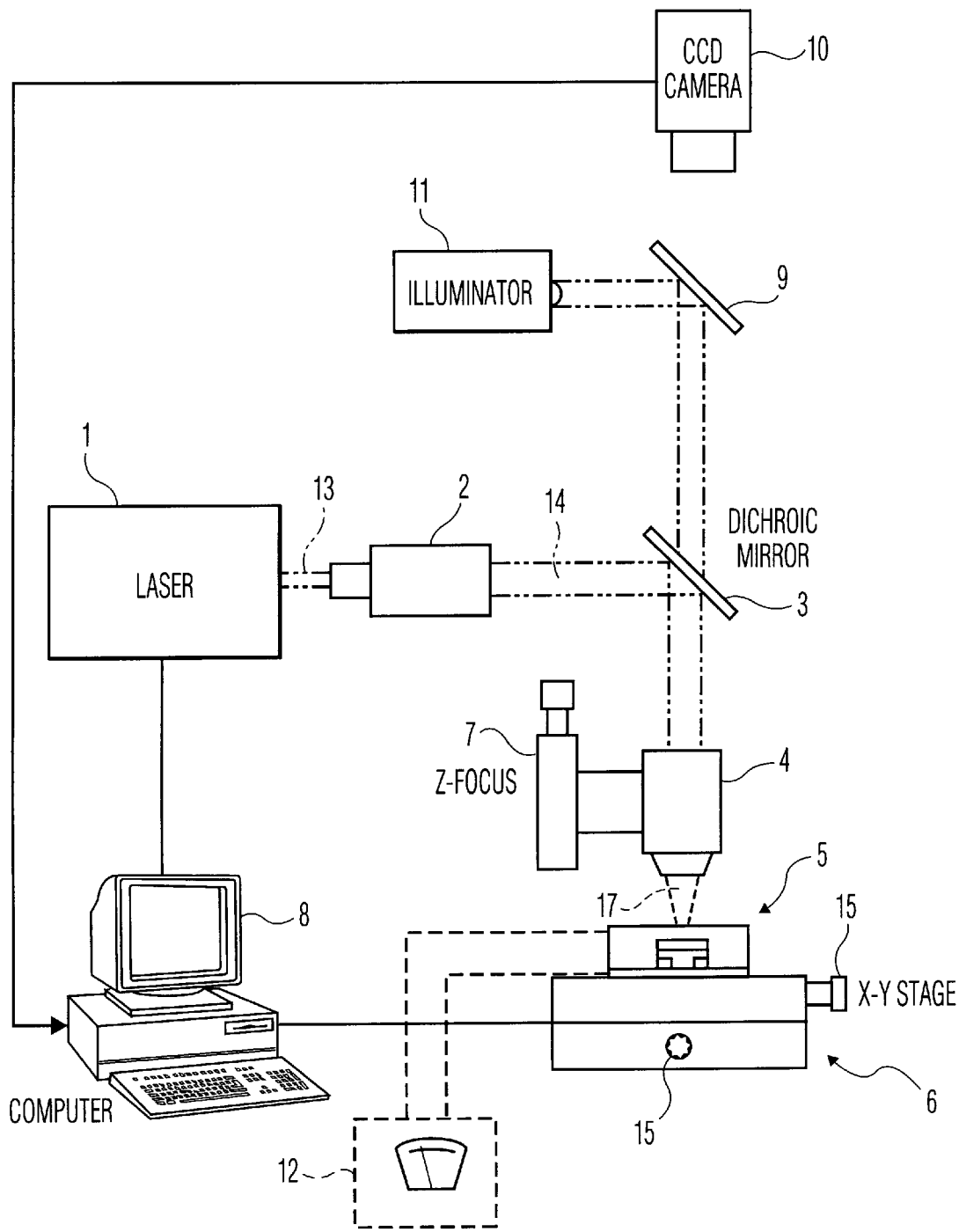
FIG. 1 is a side plan view of laser metal deposition apparatus including an exemplary embodiment of the present invention.

FIG. 1 illustrates an exemplary laser metal deposition apparatus according to the present invention. Laser 1 is a harmonically doubled solid state Q-switched Nd:YLF or Nd:YAG laser, available from Continuum Inc., in Santa Clara, Calif. Laser beam 13 from laser 1 is expanded by telescope 2 into expanded beam 14. Expanded beam 14 shines on dichroic mirror 3 which directs expanded beam 14 into objective lens 4. Focusing mechanism 7 is used to adjust the focus of the beam 17 provided by the objective lens 4. Objective lens 4 focuses the expanded beam 14 to a diffraction limit spot on sample 5. An optional power supply 12 may be used to create an electric field across the sample 5.

In the exemplary embodiment shown in FIG. 1, illuminator 11 provides light that is deflected by mirror 9 onto dichroic mirror 3. Illuminator 11 is used as a white light source to illuminate sample 5 so the process and location of the focused spot can be monitored. A suitable illuminator is available from Edmund Scientific Company in Barrington, N.J.

Also, in the exemplary embodiment, CCD camera 10 is used to image and monitor the process location. The image is fed to computer 8 which computes subsequent process locations based on a programmed path. Any state of the art video camera is suitable for this purpose. When repairing metal lines, the image from the CCD camera 10 may also be used to identify the location of defects in metal lines to repair.

Sample 5 is supported on stage 6. Stage 6 is equipped with X-Y motion controls 15 that are controlled by computer 8.

Suitable motion controls and computer are available from New England Affiliated Technologies in Lawrence, Mass., and comprise, for example, an XY-8080 precision stage, a PCX2 controller, and a 202M microstepping drive, with the controller interfaced to a 486 IBM PC or compatible.

Computer 8 also controls the power of laser 1. By adjusting the position of stage 6 and the power of laser 1, computer 8 enables the deposition of specific patterns on sample 5.

Figure 2:
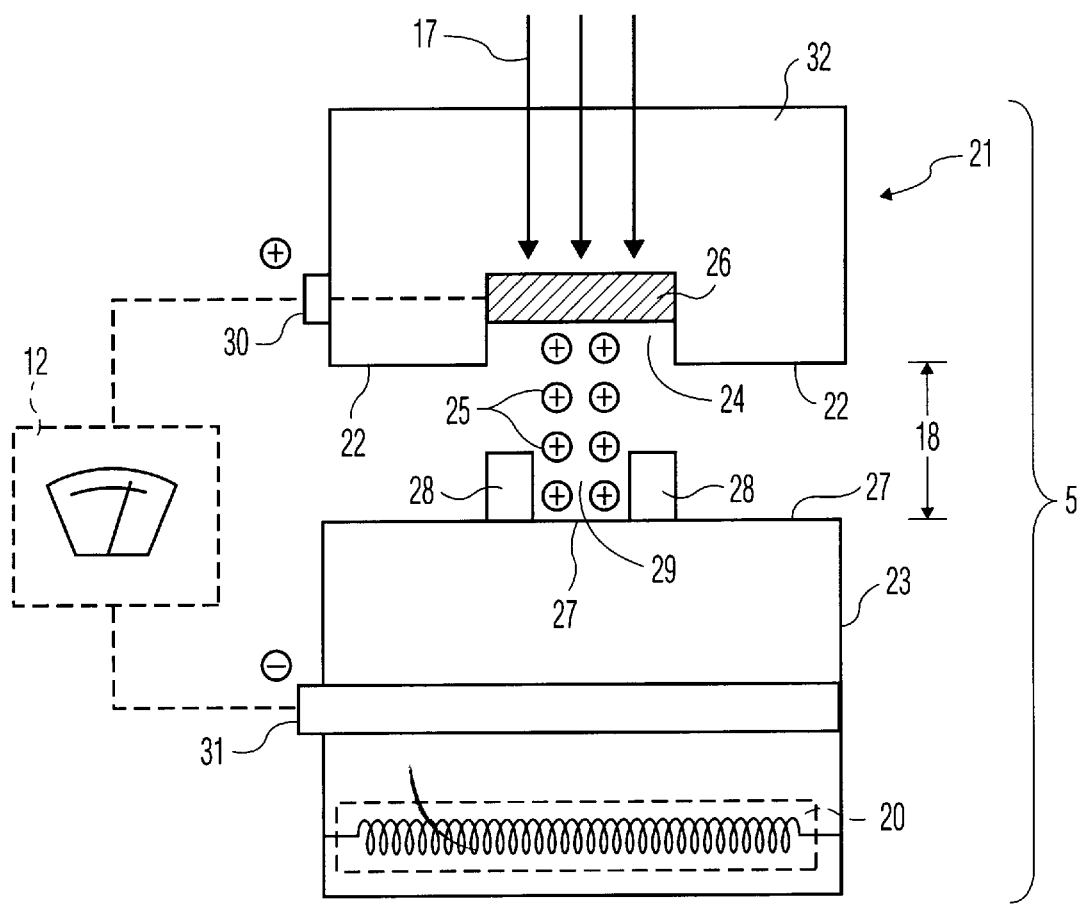
FIG. 2 is a side plan view of an exemplary donor plate according to the present invention.

FIG. 2 illustrates a sample 5 according to the present invention. The sample 5 includes a donor plate 21 and a deposition substrate 23. The donor plate 21 includes a donor substrate 32, a donor surface 22, a channel 24, and a metallic material 26 coating the channel 24.

Figure 3A:
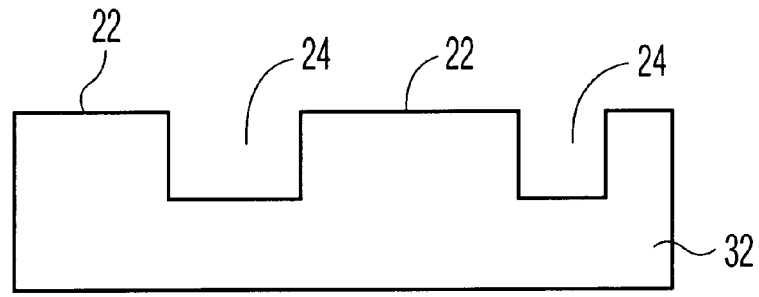
FIGS. 3A–3C illustrate a process of manufacturing a donor plate according to the present invention.
Figure 3B:
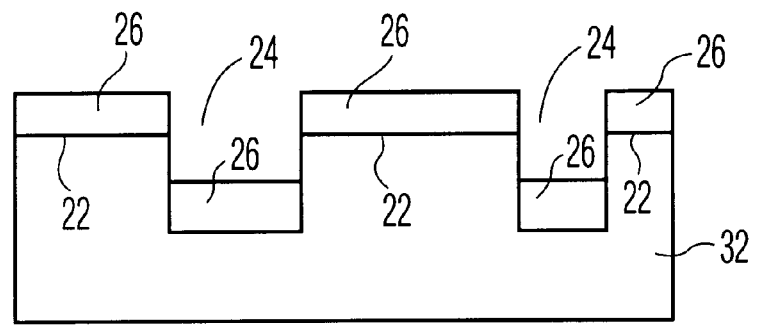
Figure 3C:
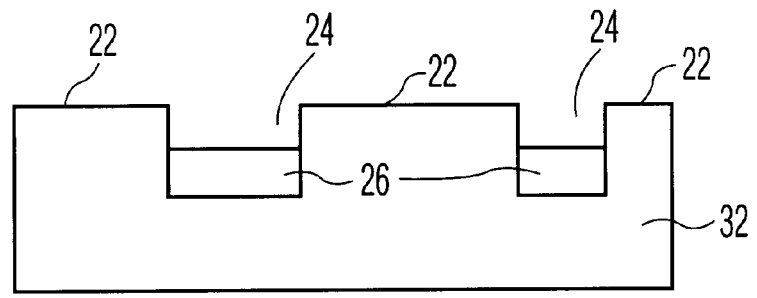

FIGS. 3A–3C illustrate a method of forming the donor plate 21. As shown in FIG. 3A, at least one channel 24 is formed in a donor substrate 32 having a donor surface 22. The donor substrate 32 is preferably glass. The channels 24 may be formed by etching the channels 24 into the donor substrate 32. As shown in FIG. 3B, a metallic material 26 is deposited upon the donor surface 22 of the donor substrate 32 and in the channels 24. The metallic material 26 may be deposited using sputtering, e-beam deposition or chemical vapor deposition (CVD), for example. Preferably, the metallic material 26 is copper, gold or silver. As shown in FIG. 3C, the metallic material 26 is then removed from the donor surface 22 of the donor substrate 32 while retained in the channels 24. The metallic material 26 may be removed from the donor surface 22 by chemical-mechanical polishing (CMP), for example.

As shown in FIG. 2, the deposition substrate 23 has a deposition surface 27 upon which a metal line is to be deposited. The deposition substrate 23 is disposed so the deposition surface 27 is adjacent the donor surface 22 of the donor plate 21. In the exemplary embodiment, the deposition substrate 23 is glass.

The focused beam 17 passes through donor substrate 32 of the donor plate 21 and impinges on the metal coating 26 in the channel 24. The contact of focused beam 17 with the metal coating 26 results in ablation of the metal coating 26. During ablation, metal ions 25 accelerate away from the metal coating 26. As metal ions 25 accelerate away from the donor plate 21 the metal ions 25 contact the deposition substrate 23. The metal ions 25 accelerate away from the donor plate 21 due to the laser ablation-generated acoustic shock waves. In the embodiment illustrated in FIG. 2, laser ablation is used to repair a gap 29 in a metal line 28. The teachings of this invention may also be applied to forming a metal line on the deposition substrate 23 when a metal line is not present on the deposition substrate 23.

Figure 4A:
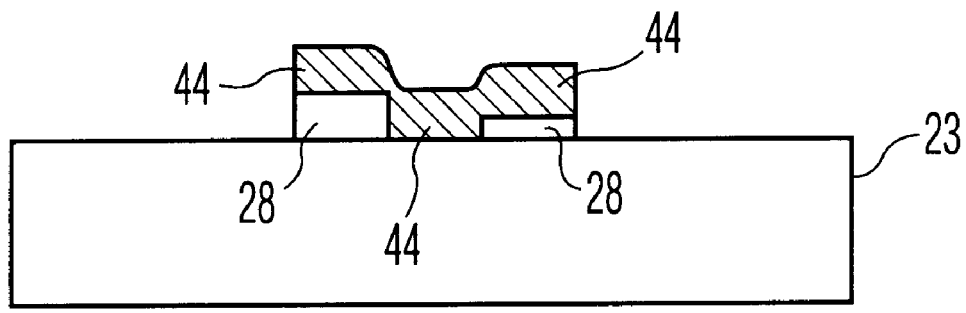
FIGS. 4A–4B illustrate the reduction of non-uniformities in thickness of a deposited metal line.
Figure 4B:
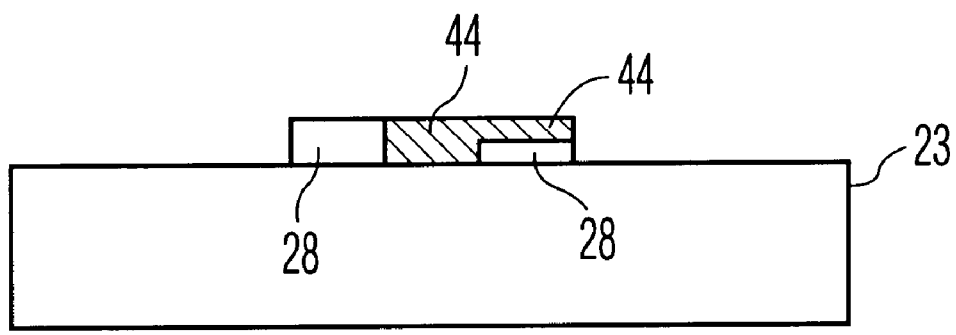

After ablation of the metal coating 26, variations in the thickness of the deposited metal line may be adjusted. For example, as shown in FIG. 4A, when a metal coating 26 is ablated to repair a metal line 28, the thickness of the resulting metal line is not uniform. The deposited metal 44 causes the resulting metal line to be thicker where the original metal line 28 was thicker before ablation. The non-uniformities of the resulting metal line may then be reduced to provide a metal line as shown in FIG. 4B. Non-uniformities in thickness may be removed by methods known to those skilled in the art such as by using a laser or by chemical-mechanical polishing (CMP).

The spacing 18 between the donor plate 21 and the deposition substrate 23 may be adjusted to vary the feature size (width) of the resulting metal lines on deposition substrate 23. As the spacing 18 increases, the feature size of the deposited metal lines increases.

Figure 5:
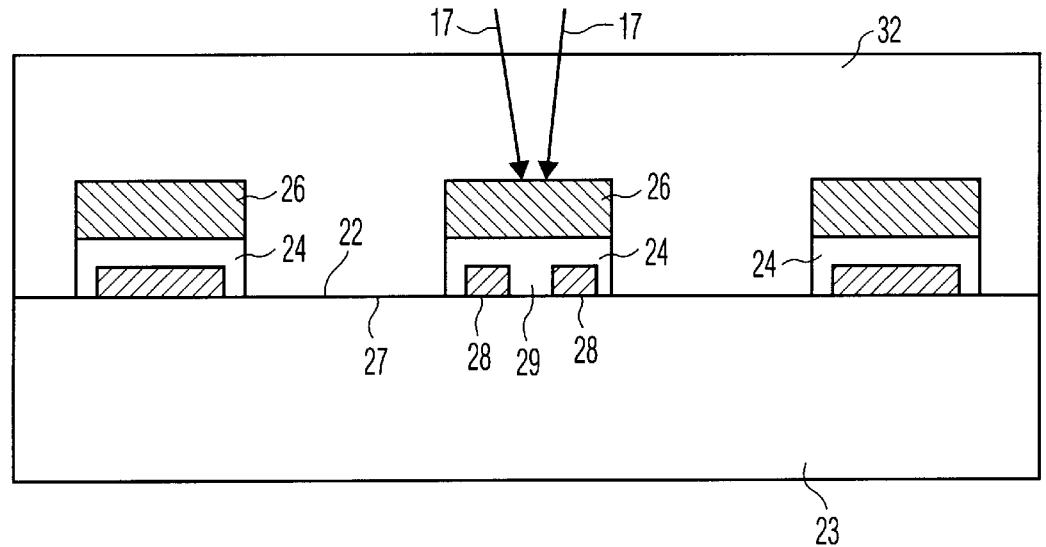
FIG. 5 is a side plan view of a donor plate and deposition substrate according to the present invention before laser ablation.
Figure 6:
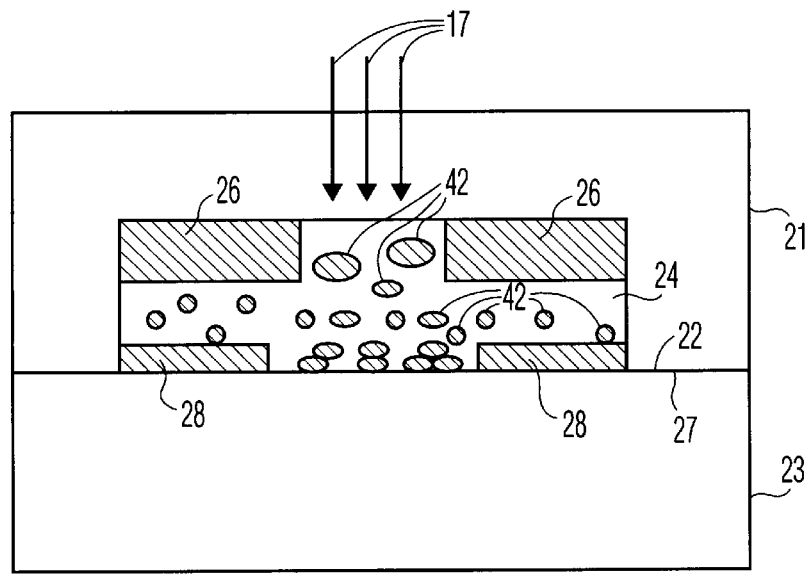
FIG. 6 is side plan view of a donor plate according to the present invention during laser ablation.

In one exemplary embodiment as shown in FIG. 5, the spacing is minimal and the donor plate 21 is disposed upon the deposition substrate 23 such that the donor surface 22 is in contact with the deposition surface 27. Thus, the cavity 24 mechanically restricts the deposition of the metal ions 25 onto the deposition substrate 23. FIG. 6 illustrates a donor plate 21 according to the present invention during laser ablation of the metallic material 26 from the channel 24. In FIG. 6, the channel 24 restricts the deposition of metal droplets and mist 42 to the area defined by the channel 24.

Figure 7A:
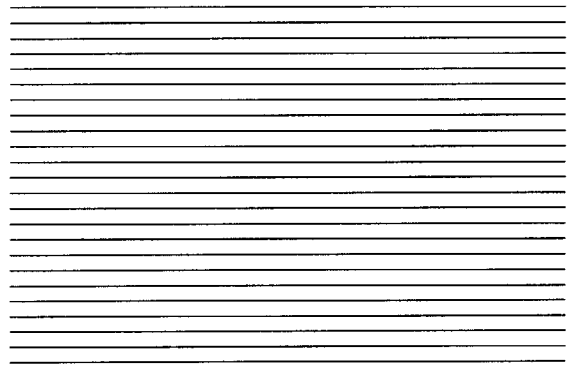
FIGS. 7A–7C illustrate patterns of lines used to visually align the disposition of the donor plate with respect to the deposition substrate.
Figure 7B:
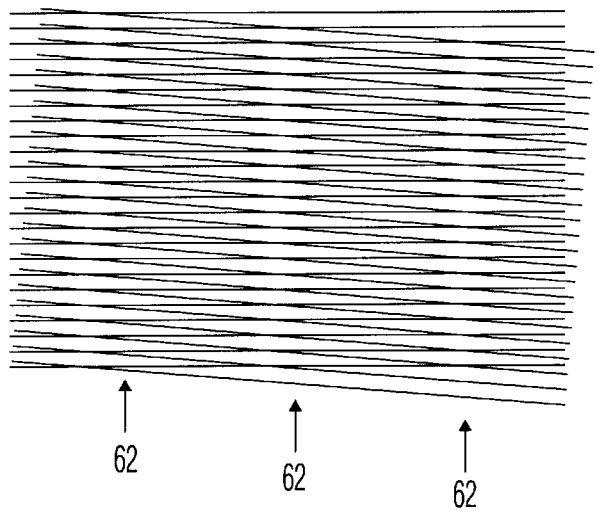
Figure 7C:
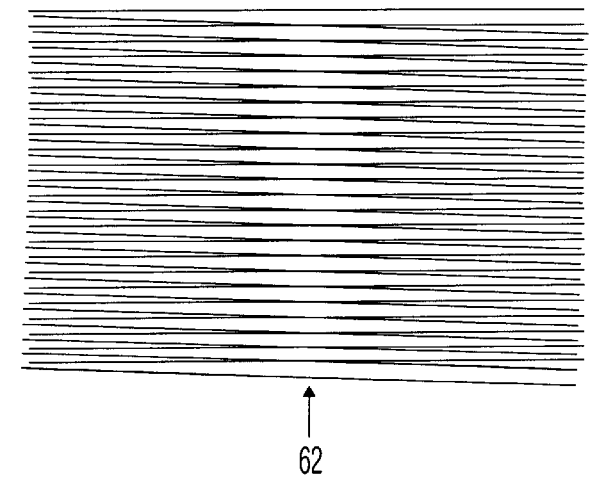

A method of aligning the donor substrate 21 and the deposition substrate 23 is described with reference to FIGS. 7A–7C. A pattern of lines, as shown in FIG. 7A, may be formed upon each of the donor plate 21 and the deposition substrate 23. The patterns of lines may be displayed by the image from the CCD camera 10. When the patterns of lines on the donor substrate 21 and the deposition substrate 23 are in alignment, a pattern of lines as in FIG. 7A will be visible. When the donor substrate 21 and the deposition substrate 23 are misaligned, a moiré pattern as shown in FIGS. 7B and 7C will be visible. The lines 62 in the moiré pattern indicate the extent of misalignment. Thus, the pattern in FIG. 7C has a single line 62 and is closer to alignment than the pattern in FIG. 7B which has three lines 62.

As shown in FIG. 2, in an exemplary embodiment, an electric field may be applied between the donor plate 21 and the deposition substrate 23 using power supply 12. Power supply 12 has a positive electrode 30 attached to the metallic material 26. A negative electrode 31 is connected to deposition substrate 23. Preferably, the voltages applied across the electrodes 30, 31 are at least 300 volts. When using an electric field, the metal ions 25 are driven toward the deposition plate 23 by an electrostatic force due to the electric field in addition to the laser ablation-generated acoustic shock waves.

The electric field applied across donor plate 21 and deposition substrate 23 also assists the bonding of metal ions 25 to deposition substrate 23. Because of the contact of the negative electrode with deposition substrate 23, the positive ions such as sodium ions in deposition substrate 23 migrate away from the deposition surface 27 toward the negative electrode 31. This leaves behind negative ions such as oxygen in the deposition substrate 23. These negative ions electrostatically bond with the positive metal ions that contact the deposition surface 27. A permanent chemical seal due to a thin metal oxide layer is formed after the electric field is removed. Conducting metal lines can thus be formed on deposition surface 27 of the deposition substrate 23 from metal ions 25.

As shown in FIG. 2, a hot plate 20 may be used to augment the migration of positive ions within deposition substrate 23 to the negative electrode 31 and thus enhance the bonding of metal ions 25 to the deposition surface 27 of the deposition substrate 23. The heat increases the diffusion and allows for greater mobility of the ions in the deposition substrate 23.

By adjusting stage controls 15 and the power of laser 1, computer 8 enables movement of stage 6, and hence sample 5, under beam 17. This allows metal line patterns to be written on sample 5. Alternatively, the beam 17 can be moved with a scanner and a scanning lens with the sample 5 held stationary under the beam 17. This invention is not limited to the method of positioning the sample 5 with respect to the beam 17 as described above. Other positioning methods and apparatus are known to those skilled in the art such as that described by LaPlante et al. in U.S. Pat. No.

5,168,454, incorporated herein by reference for its teachings on laser assisted machining.

The thickness of metal material 26 in a channel 24 may be varied in order to change the thickness of the metal lines deposited onto the deposition substrate 23. A thicker coating of metallic material 26 in the channel 24 allows more metal ions 25 to be ablated. This produces a thicker metal line.

Figure 8:
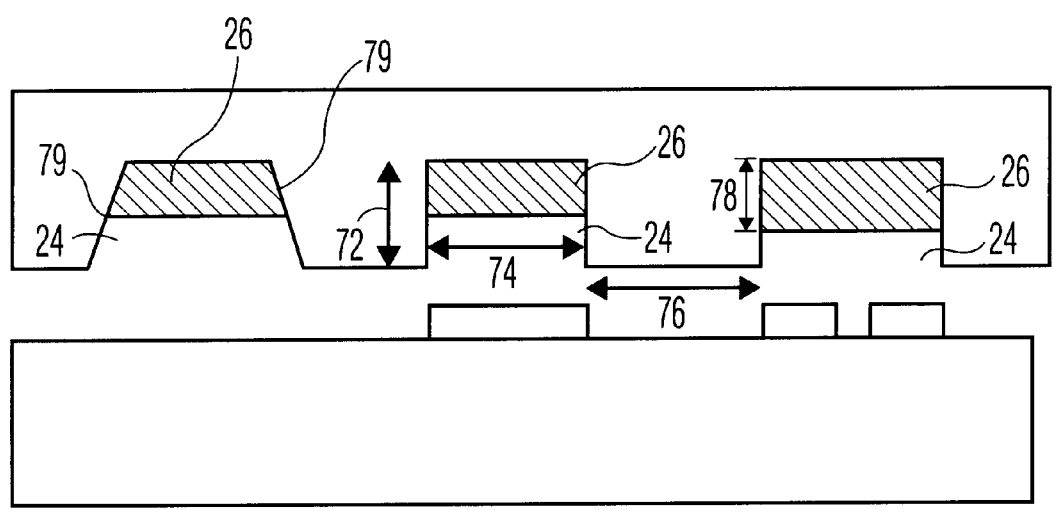
FIG. 8 illustrates exemplary variations of a donor plate.

FIG. 8 illustrates exemplary variations of a donor plate. The depth 72 of a cavity 24, the width of a cavity 74, the distance between cavities 76, and the thickness 78 of the metallic material 26 in a cavity 24 can be varied. In addition, the sidewalls 79 of a cavity 24 are not necessarily perpendicular to the deposition surface 27. The above variations may be adjusted for achieving the desired width, thickness, and uniformity of a deposited metal line.

Although this invention has been described with reference to a particular embodiment, it is not intended to be limited thereto. Rather, the scope of the invention is intended to be interpreted according to the scope of the appended claims.

What is claimed:

1. A method of metal line deposition using a focused coherent light beam comprising the steps of:
   (a) forming a donor plate having a donor substrate transparent to the focused coherent light beam, a channel in a donor surface of the donor plate, and a metallic material within the channel to the relative exclusion of areas on the donor substrate outside of the channel;
   (b) disposing the donor plate in spaced relation to a deposition substrate such that the deposition substrate is adjacent the donor surface of the donor plate;
   (c) directing the focused coherent light beam through the donor substrate of the donor plate and onto the metallic material in the channel to ablate the metallic material from the channel of the donor plate by discharging ions of the metallic material away from the donor plate and onto the deposition substrate to form the metal line.

2. A method of metal line deposition according to claim 1 further comprising the step of applying an electric field across the donor plate and the deposition substrate to drive the ions of the metallic material to the deposition substrate and to electrostatically assist bonding of the ions thereto.

3. A method of metal line deposition according to claim 1 wherein step (b) comprises the step of visually aligning the donor plate and the deposition substrate.

4. A method of metal line deposition according to claim 3 wherein each substrate includes a plurality of lines and step (b) comprises the step of visually aligning the donor plate and the deposition substrate by eliminating a moiré pattern as viewed through the donor plate.

5. A method of metal line deposition according to claim 1 wherein step (c) further comprises the steps of:
   maintaining the focused coherent light beam in a fixed position;
   mechanically coupling the donor plate to the deposition substrate; and
   actuating the coupled donor plate and deposition substrate.

6. A method of metal line deposition according to claim 1 wherein step (c) further comprises:
   maintaining the donor plate and the deposition substrate in a fixed position; and
   actuating the focused coherent light beam.

7. A method of metal line deposition according to claim 1 wherein step (a) comprises the steps of:
   providing a donor plate having a donor surface;
   etching a channel into the donor surface of the donor plate;
   depositing a metallic material in the channel.

* * * * *